United States Patent [19]

Klose

[11] Patent Number: 5,212,104
[45] Date of Patent: May 18, 1993

[54] METHOD FOR MANUFACTURING AN MOS TRANSISTOR

[75] Inventor: Helmut Klose, Munich, Fed. Rep. of Germany

[73] Assignee: Siemens Aktiengesellschaft, Munich, Fed. Rep. of Germany

[21] Appl. No.: 848,238

[22] Filed: Mar. 9, 1992

[30] Foreign Application Priority Data

Apr. 26, 1991 [DE] Fed. Rep. of Germany ....... 4113755

[51] Int. Cl.$^5$ ............................................ H01L 21/265
[52] U.S. Cl. .......................................... 437/40; 437/44; 437/45; 437/164; 437/89; 437/108
[58] Field of Search ............... 437/40, 41, 44, 45, 437/164, 89, 108, 110

[56] References Cited

U.S. PATENT DOCUMENTS

| | | | |
|---|---|---|---|
| 4,902,643 | 2/1990 | Shimawaki | 437/110 |
| 5,008,211 | 4/1991 | Yamazaki | 437/110 |

FOREIGN PATENT DOCUMENTS

| | | |
|---|---|---|
| 2911726 | 10/1979 | Fed. Rep. of Germany . |
| 0050452 | 3/1982 | Japan ................................. 437/164 |
| 58-157169 | 9/1983 | Japan . |
| 59-188175 | 10/1984 | Japan . |
| 61-116875 | 6/1986 | Japan . |

OTHER PUBLICATIONS

Van Gorkum et al., "Atomic Layers Doping (ALD) Technology in Si and its Application to a New Structure FET", Journal of Crystal Growth, vol. 95, No. 1-4, Feb. 1989, pp. 480-483.

Yamaguchi et al., "A New Short Channel MOSFET with an Atomic Layer Doped Impurity Profile (ALD MOSFET)", Japanese Journal of Applied Physics, vol. 22, No. 22, 1983, pp. 267-270 Supplement 22-1.

"Hot-Carrier Injection Suppression Due to the Nitride-Oxide LLD Spacer Structure", by T. Mizuno, IEEE Transactions of Electron Devices, vol. 38, No. 3, Mar. 1991, pp. 584-589.

"$\pi$-Heterostructure Field Effect Transistors for VLSI Applications" by K. Lee et al, IEEE Transactions on Electron Devices, vol. 37, No. 8, Aug. 1990, pp. 1810-1820.

Primary Examiner—Brian E. Hearn
Assistant Examiner—Tuan Nguyen
Attorney, Agent, or Firm—Hill, Steadman & Simpson

[57] ABSTRACT

A method for the manufacture of an MOS transistor. A channel region is produced by selective epitaxy on a substrate (1) doped with a first conductivity type, said channel region containing a delta-shaped layer (5) doped with the first conductivity type. Source region (13) and drain region (14) are formed, in particular, by drive-out from a doped glass layer (12).

14 Claims, 3 Drawing Sheets

METHOD FOR MANUFACTURING AN MOS TRANSISTOR

BACKGROUND OF THE INVENTION

In the general development of integrated circuits toward greater packing densities, MOS transistors having a reduced space requirement are needed. In a miniaturization of the structure of an MOS transistor a shortening of the gate length occurs. Either high leakage currents or high threshold voltages are observed in MOS transistors having gate lengths below 0.25 μm. Both are disadvantageous and cannot be accepted for MOS transistors of this technology generation.

It is known to avoid these disadvantages (see K. Yamaguchi et al., Jap. J. Appl. Phys. 22, suppl. 22-1, pages 267-270 (1983)) by employing a delta-doped layer in the channel region between source and drain. The delta-doped layer thereby represents a replacement for an anti-punch implantation.

A delta-doped layer has a thickness of approximately 20 nm and it is doped with the conductivity type opposite the source and drain region. It has a dopant concentration of more than $10^{19}$ cm$^{-3}$. In comparison to the traditional anti-punch implantation that forms a smeared distribution in the substrate, the dopant concentration in delta-doped layers is strictly localized.

It is known to manufacture MOS transistors having a delta-doped layer with a MESA insulation (see A. A. van Gorkum et al., J. Crystal Growth 95, pages 480-483 (1989). The wiring, however, is thereby difficult. Further, this method is not suitable for use in a manufacturing process for integrated circuits having ultra large scale integration (ULSI).

SUMMARY OF THE INVENTION

It is an object of the present invention to provide a method for manufacturing an MOS transistor having a delta-like-doped layer that is suitable for integration into the manufacturing process of an ULSI integrated circuit.

In general, the method of the present invention is a method for manufacturing an MOS transistor having the following steps:

a) a channel region is produced on a substrate composed of a semiconductor material doped by a first conductivity type in that a first layer that is undoped is epitaxially grown onto the substrate, in that a second layer that is doped by the first conductivity type and that is thinner than the first layer is epitaxially grown onto the first layer, in that a third layer that is doped by a second conductivity type opposite the first conductivity type and that is thicker than the second layer is epitaxially grown onto the second layer;

b) a source region and a drain region each of which is respectively doped of the second conductivity type are produced at two opposite sides of the channel region;

c) a gate dielectric is produced at the surface of the channel region; and d) a gate electrode that is insulated from the source region and from the drain region is produced at the surface of the gate dielectric.

The method of the present invention utilizes the fact that the layer growth by epitaxial growth can be precisely controlled to a high degree. What is also exploited is that layers that are doped in situ can be produced in epitaxial growth from the vapor phase by admixture of gases containing dopant. These layers can have their doping set with great precision via the gas concentration and can have their thickness set with great precision via the layer growth. The method of the present invention therefore has the advantage that the second layer that acts as a delta-shaped layer can be manufactured with good control in a thickness of, for example, 20 nm. The third layer arranged thereabove, wherein the channel is fashioned in the finished transistor, can likewise have its thickness set in well-controlled fashion via the layer growth.

It lies within the framework of the present invention to use a silicon substrate as a substrate and to form the channel region of silicon.

By applying an insulating layer onto the surface of the substrate and by structuring the insulating layer so that it has an opening, wherein the surface of the substrate is uncovered and the opening defines a region for the MOS transistor. By subsequent formation of the channel region by selective epitaxy on the surface of the substrate within the opening, the MOS transistor is surrounded by an insulating structure in a self-aligned fashion.

It lies within the framework of the present invention to completely cover the gate electrode with an insulating structure. The insulating layer and the insulating structure are thereby formed of a material with respect whereto the first layer, the second layer and the third layer are selectively etchable. In an anisotropic etching step, depressions extending down into the first layer are selectively generated vis-a-vis the insulating layer and vis-a-vis the insulating structure at both sides of the gate electrode. Subsequently, a glass layer is applied surface-wide, this being provided with dopant of the second conductivity type. In a tempering step, the source and the drain region are formed by drive-out of the dopant into the uncovered surfaces of the first layer, of the second layer and of the third layer. The tempering step must thereby be controlled such that the dopant distribution in the second layer that acts as a delta-shaped layer, and in the third layer remains essentially unmodified. It lies within the framework of the present invention to implement the tempering step in a rapid annealing process.

It is especially advantageous to generate the insulating structure by forming a first insulating layer on the gate electrode. The first insulating layer thereby has sidewalls perpendicular to the surface of the substrate that it shares in common with the gate electrode. Sidewall insulations, also referred to as spacers, are generated at the sidewalls by surface-wide, al deposition and subsequent anisotropic etching of a second insulating layer. In this method, the arrangement of the source and drain regions vis-a-vis the gate electrode and vis-a-vis the insulating layer occurs self-aligned. The spacing between the gate electrode and the source or drain region is defined by the width of the sidewall insulations. This width of the sidewall insulations is also dependent on the thickness with which the second insulating layer is deposited. A mask layer for defining source and drain region is thereby eliminated.

In a further development of the present invention a rapid thermal annealing process in the temperature range from 1000° through 1050° C. for a duration of approximately 10 seconds is used as the temperature step. Also, the first layer can be formed with a thickness of approximately 300 nm, the second layer can be formed with a thickness of approximately 20 nm, and the third layer can be formed with a thickness of approximately 100 nm.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
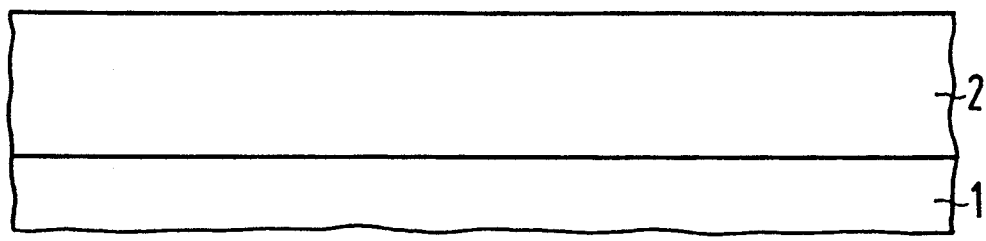
FIGS. 1 through 7 show steps of the manufacturing method of the present invention.

An insulating layer 2 is applied on a substrate 1 (see FIG. 1). For example, a p-doped substrate of monocrystalline silicon having 100 surface orientation is used as a substrate. After known initial cleaning steps, the insulating layer 2 of $SiO_2$ is grown on to a thickness of, for example, 400 nm. This, for example, occurs thermically or via a deposition apparatus.

Figure 2:
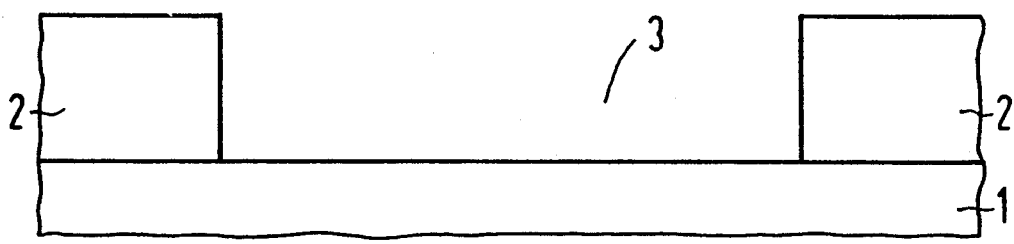

The insulating layer 2 is structured in such a way using a photoresist technique (not shown) and of a following dry etching to produce an opening 3. The surface of the substrate 1 is uncovered inside the opening 3 (see FIG. 2). The opening 3 defines a region for an MOS transistor.

Figure 3:
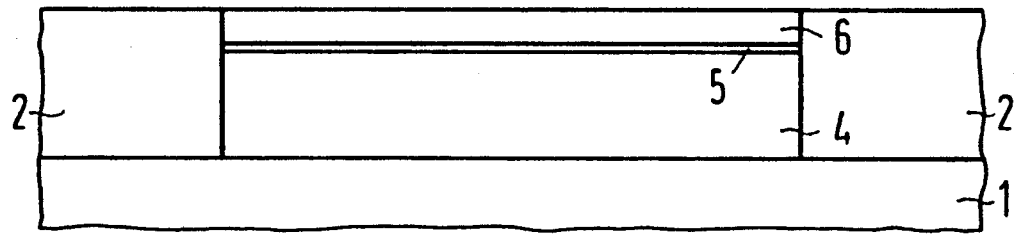

Subsequently, a first layer 4, a second layer 5 and a third layer 6 are produced in the opening 3 such that the opening 3 is essentially filled up (see FIG. 3). The first layer 4 is deposited undoped to a thickness of, for example, 300 nm. The second layer is deposited, for example, p-doped to a thickness of, for example, 20 nm. The doping occurs, for example, by adding boron in a concentration of at least $10^{19}$ cm$^{-3}$. The third layer 6 is deposited n-doped. It has a thickness of approximately 100 nm.

Figure 4:
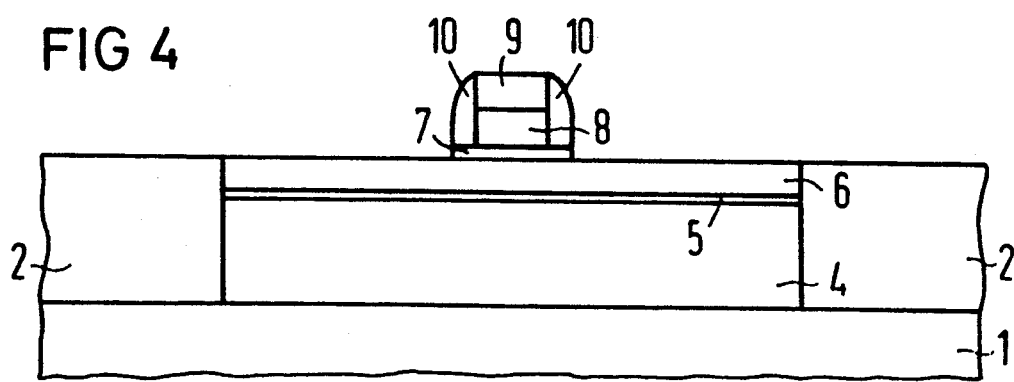

Subsequently, a gate dielectric 7 is grown or deposited on the surface of the third layer 6 (see FIG. 4). The gate dielectric 7 is composed, for example, of $SiO_2$ or of a nitride/$SiO_2$ compound. A gate electrode 8 is produced above the gate dielectric 7. This occurs, for example, by surface-wide deposition of a polysilicon layer that is doped via ion implantation or occupation. An oxide layer is deposited on the polysilicon layer using a CVD process. This double layer composed of the polysilicon layer and of the oxide layer is phototechnically structured. The gate electrode 8 and a first oxide layer 9 are thereby produced. As a result of the common structuring, the first oxide layer 9 and the gate electrode 8 have common sidewalls perpendicular to the surface of the substrate 1. Subsequently, a second oxide layer is deposited in conformity. The second oxide layer is anisotropically etched using a dry etching, so that sidewall insulations 10 of $SiO_2$ are produced at both sides of the gate electrode 9 and of the first oxide layer 9. The term spacer is also employed for the sidewall insulations 10. The width of the sidewall insulations 10 at the surface of the third layer 6 is established by the thickness of the second oxide layer.

Care must be exercised in the production of the sidewall insulations 10 to ensure that the $SiO_2$ etching is overdrawn to such an extent that the surface of the third layer 6 outside the gate electrode and the sidewall insulations 10 is completely uncovered, so that the bare silicon crystal appears.

Figure 5:
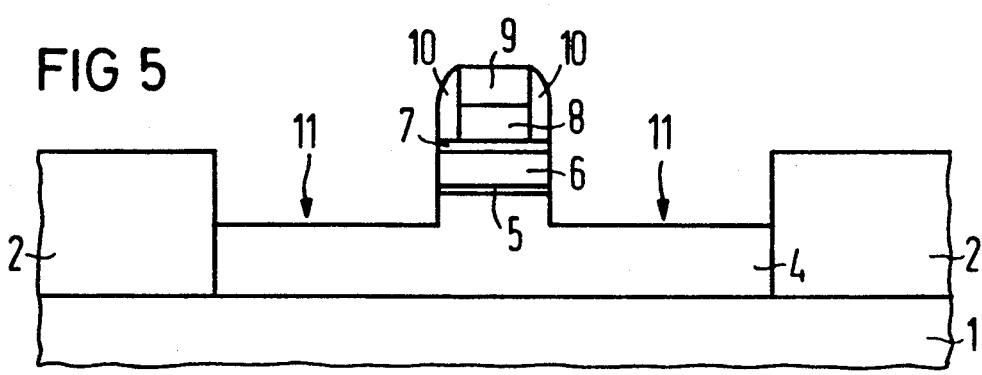

Depressions 11 are produced inside the insulating layer 2 to the side of the gate electrode 8 by an anisotropic silicon etching that is selected vis-a-vis $SiO_2$ (see FIG. 5). The depressions 11 extend down into the first layer 4, so that the second layer 5 and the third layer 6 are completely removed to the side of the sidewall insulations 10.

Figure 6:
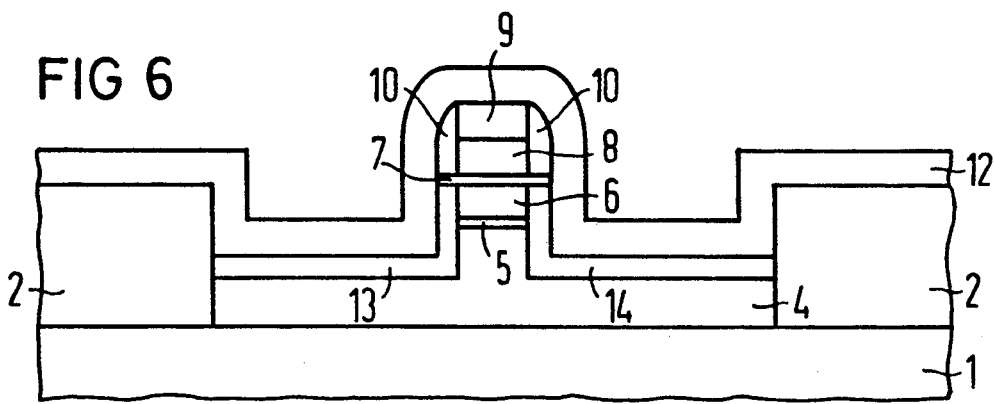

Subsequently, a glass layer 12 doped, for example, with arsenic is deposited surface-wide in conformity. As a result of a slight drive-out of the dopant at, for example, 1000° through 1050° C. over, for example, 10 seconds, a source region 13 and a drain region 14 are formed at the surfaces of the first layer 4, of the second layer 5 and of the third layer 6 that are in contact with the glass layer 12. The temperature step must be implemented such that the second layer 5 that acts as delta-doped layer diverges to only an insignificant degree (see FIG. 6).

Subsequently, the MOS transistor is finished by planarization, etching via holes and metallization. This occurs, for example, by surface-wide deposition of a dielectric 15 (see FIG. 7). Via holes that are filled up with metallizations 16 are opened in the dielectric 15 and in the glass layer 12 above source region 13 and drain region 14.

Alternatively, the MOS transistor is finished in that a planarizing layer 17 of, for example, BPSG is first deposited. Via holes down to the source region 13 and the drain region 14 are opened in the planarizing layer 17 and in the glass layer 12. The via holes are filled with tungsten 18. Aluminum contacts 19 covering the tungsten fills 18 are applied on the surface of the planarizing layer 17 (see FIG. 8).

Figure 7:
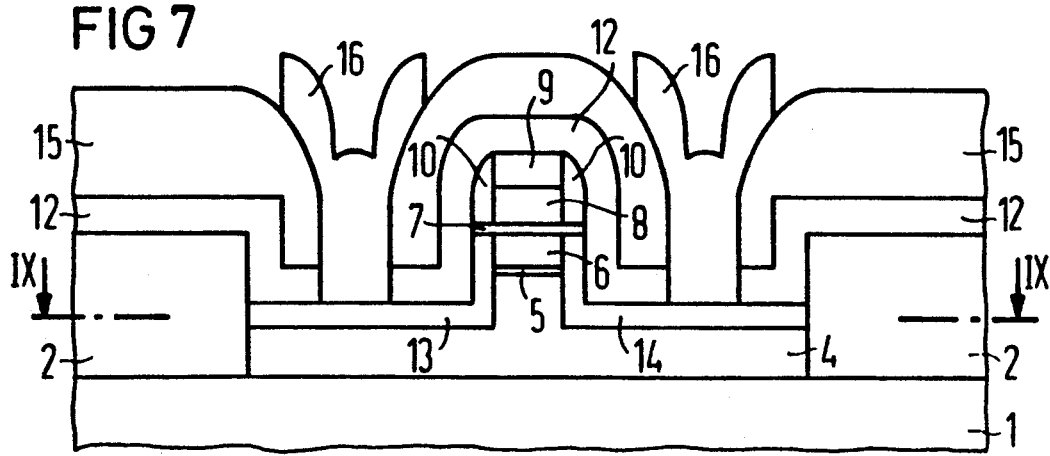
Figure 8:
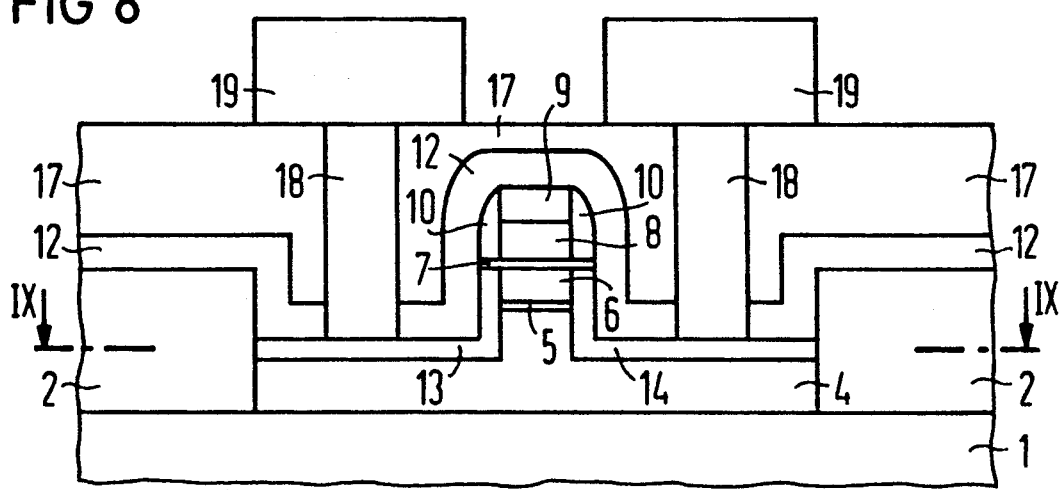
FIG. 8 shows an alternative contacting possibility of the present invention.
Figure 9:
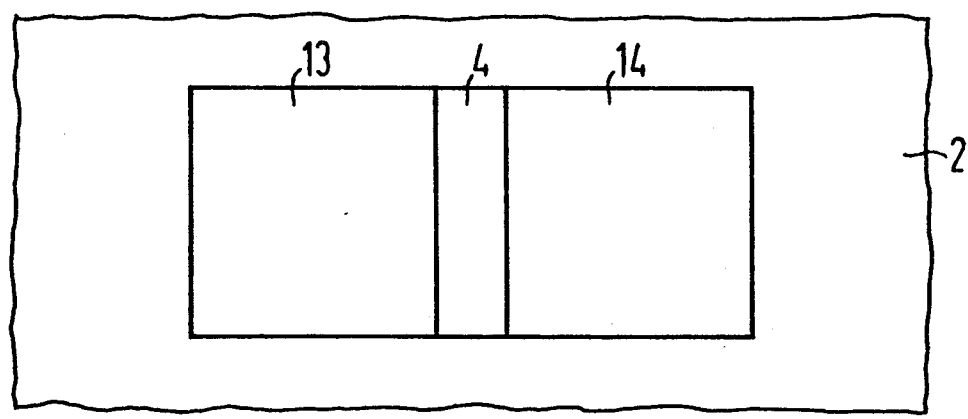
FIG. 9 is a section view referenced IX—IX in FIG. 7 and in FIG. 8.

The section referenced IX—IX in FIG. 7 and in FIG. 8 may be seen in FIG. 9. The MOS transistor is completely surrounded by the insulating layer 2.

The method has been set forth with reference to the example of an NMOS transistor. It can be completely analogously transferred to a PMOS transistor.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing an MOS transistor comprising the steps of:
    a) applying an insulating layer onto a surface of a substrate that is doped with a first conductivity type;
    b) structuring the insulation layer such that said insulating layer has an opening in which the surface of the substrate is exposed;
    c) growing a first layer that is undoped on the surface of the substrate that is exposed inside the opening on the basis of selective epitaxy;
    d) growing a second layer by selective epitaxy on the first layer, said second layer being doped with the first conductivity type and being thinner than the first layer;

e) growing a third layer on the second layer by selective epitaxy, said third layer being doped with a second conductivity type opposite said first conductivity type and being thicker than the second layer;

f) forming from the first layer, the second layer and the third layer a channel region of the MOS transistor;

g) producing a gate dielectric at the surface of the channel region;

h) producing a gate electrode at the surface of the gate dielectric;

i) completely covering the gate electrode with an insulating structure;

j) forming the insulating structure and the insulation layer of a material such that the first layer, the second layer and the third layer are selectively etchable with respect to the material of the insulting structure and the insulating layer;

k) producing depressions extending into the first layer in an anisotropic etching step wherein the insulating structure and the insulation layer act as an etching mask;

l) applying surface-wide a glass layer that is provided with a dopant of the second conductivity type;

m) forming, in a tempering step, a source region and a drain region by driving the dopant out into surfaces of the first layer, of the second layer and of the third layer having contact with the glass layer;

n) managing the tempering step such that dopant distribution in the second layer and in the third layer remains substantially unaltered.

2. The method according to claim 1, wherein a silicon substrate is used as said substrate and wherein said channel region is formed of silicon.

3. The method according to claim 1, wherein a short-rapid thermal annealing process in a temperature range from 1000° through 1050° C. for a duration of approximate 10 seconds is used as the temperature step.

4. The method according to claim 1, wherein said method further comprises the following steps:
for producing the insulating structure, forming a first insulating layer on the gate electrode, said first insulating layer having sidewalls perpendicular to the surface of the substrate shared in common with the gate electrode;
producing sidewall insulations at the sidewalls by surface-wide, conforming deposition and subsequent anisotropic reetching of a second insulating layer.

5. The method according to claim 1, wherein said first layer is formed with a thickness of approximately 300 nm, said second layer is formed with a thickness of approximately 20 nm, and said third layer is formed with a thickness of approximately 100 nm.

6. A method for manufacturing an MOS transistor comprising the steps of:

a) applying an insulating layer onto a surface of a substrate that is doped with a first conductivity type;

b) structuring said insulating layer such that said insulating layer has an opening wherein the surface of said substrate is uncovered and which defines a region for the MOS transistor;

c) growing a first layer that is undoped on the surface of the substrate that is exposed inside the opening on the basis of selective epitaxy;

d) growing a second layer by selective epitaxy on the first layer, said second layer being doped with the first conductivity type and being thinner than the first layer;

e) growing a third layer on the second layer by selective epitaxy, said third layer being doped with a second conductivity type opposite said first conductivity type and being thicker than the second layer, the first layer, the second layer and the third layer forming a channel region of the MOS transistor;

f) producing a source region and a drain region, each of which is respectively doped of said second conductivity type, at two opposite sides of said channel region;

g) producing a gate dielectric at a surface of said channel region;

h) producing a gate electrode, at a surface of said gate dielectric;

i completely covering the gate electrode with an insulating structure;

j forming the insulating layer and the insulating structure of a material such that said first layer, said second layer and said third layer are selectively etchable with respect to said material;

k in an anisotropic etching step, which is selective to said insulating layer and said insulating structure, producing depressions extending down to said first layer.

7. The method according to claim 6, wherein a silicon substrate is used as said substrate and wherein said channel region is formed of silicon.

8. The method according to claim 6, wherein said producing a source region and a drain region further comprises the following steps:
applying surface-wide a glass layer with dopant of said second conductivity type;
in a temperature step, forming the source region and the drain region by drive-out of the dopant into those surfaces of said first layer, of said second layer and of said third layer residing in contact with said glass layer; implementing said temperature step such that the dopant distribution in the second layer and in the third layer remains essentially unmodified.

9. The method according to claim 8, wherein a rapid thermal annealing process in a temperature range from 1000° through 1050° C. for a duration of approximately 10 seconds is used as the temperature step.

10. The method according to claim 6, wherein said method further comprises the following steps:
for producing the insulating structure, forming a first insulating layer on the gate electrode, said first insulating layer having sidewalls perpendicular to the surface of the substrate shared in common with the gate electrode;
producing sidewall insulations at the sidewalls by surface-wide, conforming depositions and subsequent anisotropic reetching of a second insulating layer.

11. The method according to claim 6, wherein said first layer is formed with a thickness of approximately 300 nm, said second layer is formed with a thickness of approximately 20 nm, and said third layer is formed with a thickness of approximately 100 nm.

12. A method for manufacturing an MOS transistor comprising the steps of:
   a) applying an insulating layer onto a surface of a substrate that is doped with a first conductivity type;
   b) structuring said insulating layer such that said insulating layer has an opening wherein the surface of said substrate is uncovered and which defines a region for the MOS transistor;
   c) growing a first layer that is undoped on the surface of the substrate that is exposed inside the opening on the basis of selective epitaxy;
   d) growing a second layer by selective epitaxy on the first layer, said second layer being doped with the first conductivity type and being thinner than the first layer;
   e) growing a third layer on the second layer by selective epitaxy, said third layer being doped with a second conductivity type opposite said first conductivity type and being thicker than the second layer, the first layer, the second layer and the third layer forming a channel region of the MOS transistor;
   f) producing a source region and a drain region, each of which is respectively doped of said second conductivity type, at two opposite sides of said channel region;
   g) producing a gate dielectric at a surface of said channel region;
   h) producing a gate electrode, at a surface of said gate dielectric;
   i completely covering the gate electrode with an insulating structure; the insulating structure being formed by forming a first insulating layer on the gate electrode, said first insulating layer having sidewalls perpendicular to surface of the substrate shared in common with the gate electrode, and producing sidewall insulations at the sidewalls by surface-wide, conforming depositions and subsequent anisotropic reetching of a second insulating layer;
   j forming the insulating layer and the insulating structure of a material such that said first layer, said second layer and said third layer are selectively etchable with respect to said material; and
   k in an anisotropic etching step, which is selective to said insulating layer and said insulating structure, producing depressions extending down to said first layer.

13. The method according to claim 12, wherein said producing a source region and a drain region further comprises the following steps:
   applying surface-wide a glass layer with dopant of said second conductivity type;
   in a temperature step, forming the source region and the drain region by drive-out of the dopant into those surfaces of said first layer, of said second layer and of said third layer residing in contact with said glass layer; implementing said temperature step such that the dopant distribution in the second layer and in the third layer remains essentially unmodified.

14. The method according to claim 12, wherein a silicon substrate is used as said substrate and wherein said channel region is formed of silicon, and wherein said first layer is formed with a thickness of approximately 300 nm, said second layer is formed with a thickness of approximately 20 nm, and said third layer is formed with a thickness of approximately 100 nm.

* * * * *